United States Patent
Göllner et al.

(10) Patent No.: US 7,381,645 B2
(45) Date of Patent: Jun. 3, 2008

(54) METHOD FOR THE PRODUCTION OF AN INTEGRATED CIRCUIT BAR ARRANGEMENT COMPRISING A METAL NITRIDE LAYER AND INTEGRATED CIRCUIT ARRANGEMENT

(75) Inventors: Reinhard Göllner, Regensburg (DE); Herbert Obermeier, Regensburg (DE)

(73) Assignee: Infineon Technologies AG, Munich (DE)

( * ) Notice: Subject to any disclaimer, the term of this patent is extended or adjusted under 35 U.S.C. 154(b) by 359 days.

(21) Appl. No.: 11/148,861

(22) Filed: Jun. 9, 2005

(65) Prior Publication Data

US 2006/0063381 A1    Mar. 23, 2006

Related U.S. Application Data

(63) Continuation of application No. PCT/DE03/04045, filed on Dec. 9, 2003.

(30) Foreign Application Priority Data

Dec. 10, 2002   (DE) ............... 102 57 681

(51) Int. Cl.
H01L 21/44    (2006.01)
H01L 21/4763  (2006.01)
(52) U.S. Cl. .............. 438/675; 438/638; 438/688; 257/E21.577
(58) Field of Classification Search ........ 438/622, 438/638, 675, 688
See application file for complete search history.

(56) References Cited

U.S. PATENT DOCUMENTS

| 4,943,539 | A  | * | 7/1990  | Wilson et al. ........... 438/629 |
| 5,470,790 | A  |   | 11/1995 | Myers et al. |
| 5,874,357 | A  |   | 2/1999  | Jun et al. |
| 5,897,374 | A  |   | 4/1999  | Lin |
| 6,475,909 | B2 | * | 11/2002 | Uozumi .................. 438/678 |

FOREIGN PATENT DOCUMENTS

| DE | 19836031 A1 | 3/1999 |
| DE | 10014915 A1 | 10/2001 |
| EP | 0 387 098 A2 | 9/1990 |
| EP | 1 073 114 A2 | 1/2001 |
| JP | 08023028 A | 1/1996 |

OTHER PUBLICATIONS

Office Action from the German Patent Office dated May 22, 2003.

* cited by examiner

*Primary Examiner*—Alexander Ghyka
(74) *Attorney, Agent, or Firm*—Brinks Hofer Gilson & Lione

(57) ABSTRACT

The document explains, inter alia, a method in which a titanium nitride layer is removed by wet chemical means (106). Following removal of the titanium nitride, further metalization strata are produced (114). The result is an integrated circuit arrangement having connections which have a low electrical resistance. The circuit arrangement is particularly suitable for the purpose of switching high powers.

24 Claims, 2 Drawing Sheets

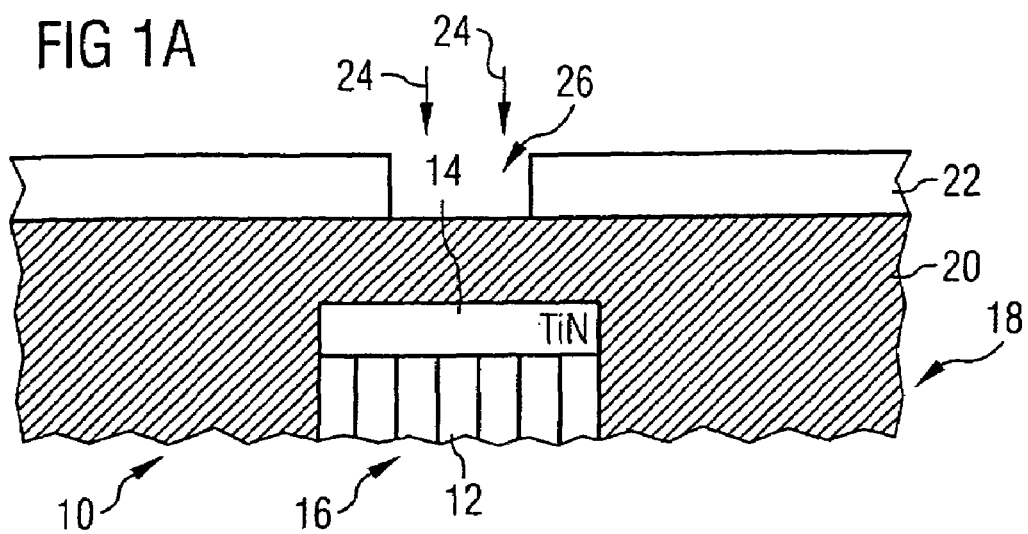
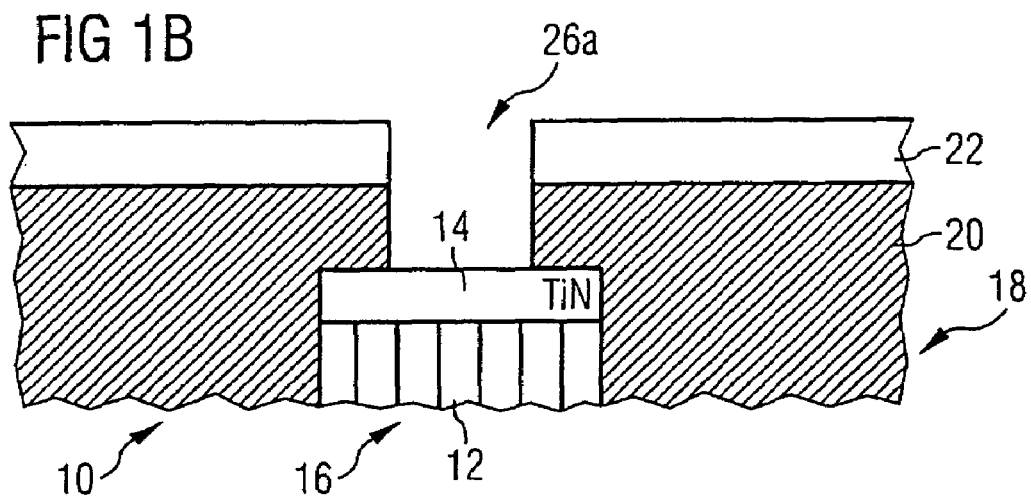
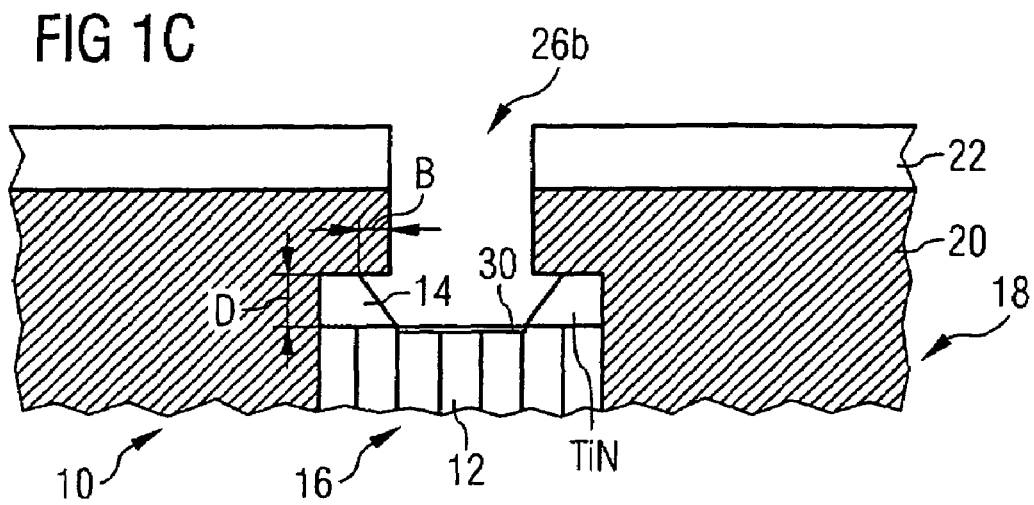

METHOD FOR THE PRODUCTION OF AN INTEGRATED CIRCUIT BAR ARRANGEMENT COMPRISING A METAL NITRIDE LAYER AND INTEGRATED CIRCUIT ARRANGEMENT

PRIORITY

This application is a continuation of International Patent Application No. PCT/DE2003/004045, filed Dec. 9, 2003, which claims the benefit of priority to German Patent Application DE 10257681.5, filed on Dec. 10, 2002, both of which are incorporated by reference herein.

TECHNICAL FIELD

The invention relates to a method in which the following steps are carried out:

an initial metalization stratum covered by an intermediate layer is produced, an insulating layer is applied after the initial metalization stratum has been produced, and the insulating layer is patterned to form at least one cutout using a dry etching process.

BACKGROUND

A metalization stratum or a metalization plane contains a multiplicity of interconnects, for example made of aluminum or copper. Various metalization strata are electrically insulated from one another by a respective insulating layer. The insulating layer is penetrated by "vias" containing connecting sections. In the connecting sections, current flows between various metalization strata during operation of the integrated circuit arrangement.

The intermediate layer is electrically conductive and serves, by way of example, as:

a diffusion barrier,
to increase the mechanical adhesion, and/or
as an antireflection layer.

Suitable materials for the intermediate layer are, by way of example, titanium nitride or tantalum nitride, or double or multiple layers with these materials, e.g. a double layer made of a titanium layer and of a titanium nitride layer.

Typical dry etching processes are:
physical dry etching,
chemical dry etching, or
chemicophysical dry etching.

If the insulating layer is made of silicon dioxide, for example, then dry etching can be carried out using fluorine-containing chemicals, for example.

SUMMARY

It is an object of the invention to specify a simple method for fabricating an integrated circuit arrangement, which method can be used, in particular, to produce electrical connections having a low electrical resistance. The intention is also to specify an integrated circuit arrangement.

The object relating to the method is achieved by a method having the method steps specified in patent claim 1. Developments are specified in subclaims.

The invention is based firstly on the consideration that the intermediate layer often has a higher electrical resistance than a metal layer in the metalization stratum. For this reason, the intermediate layer should be removed particularly at points where there is a large flow of current, i.e. particularly at the via bottoms.

In addition to the method steps cited at the outset, the inventive method therefore involves the following methods steps being carried out:

the cutout is extended using a wet chemical etching process or using a dry etching process, with material from the intermediate-layer being removed in the region of the cutout, and at least one further metalization stratum is produced after the cutout has been extended, with the cutout being filled with a metal or with a metal alloy.

A dry etching process for extending the cutout makes it possible to etch the cutout in one etching operation. By contrast, a wet chemical etching process can be carried out more easily, particularly in a shorter time. First, a wet chemical etching process does not involve the production of any polymers making the etching operation more difficult, as is the case with many dry etching processes.

Removing the intermediate layer, which, although electrically conductive, has a higher electrical resistance than the material in the metalization strata, produces a connection between the metalization strata which has a lower electrical resistance than would be the case if the intermediate layer were retained. Particularly in the case of vias with a maximum diameter smaller than 1 μm (micron) and/or in the case of vias through which relatively high switching currents flow, the effect of reducing the electrical resistance is a significant reduction in the power loss. This in turn results in low demands on cooling the integrated circuit arrangement.

In one development, the intermediate layer is made of titanium nitride or the intermediate layer contains titanium nitride. Titanium nitride can be deposited in a simple manner, for example using a CVD (Chemical Vapor Deposition) method or by sputtering.

In one development with an intermediate layer which contains titanium nitride, the material in the intermediate layer is removed in the region of the cutout using a hot alkali metal hydroxide.

Thus, titanium nitride is etched in an aqueous, alkaline peroxide-containing system, for example. In a first step, titanium nitride is oxidized in an alkaline solution to form titanium oxide ions:

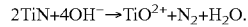
$$2TiN + 4OH^- \rightarrow TiO^{2+} + N_2 + H_2O.$$

The titanium cations $TiO^{2+}$ react further to form titanium dioxide:

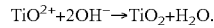
$$TiO^{2+} + 2OH^- \rightarrow TiO_2 + H_2O.$$

Titanium dioxide dissolves by reacting further with hydrogen peroxide to form titanium peroxide:

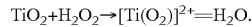
$$TiO_2 + H_2O_2 \rightarrow [Ti(O_2)]^{2+} = H_2O.$$

By way of example, the alkali metal hydroxide has a temperature of 60° C. (degrees Celsius). Alternatively, a layer containing titanium nitride can also be removed using a base or using a solution which has a basic action. In one refinement, aqueous ammonia is used as the solution with a basic action. In a subsequent refinement, the aqueous ammonia is between 20% strength and 35% strength, preferably 28% strength. 28% strength aqueous ammonia is commercially available and is also frequently used for fabricating integrated circuits. In one refinement, the etching solution is aqueous and alkaline and contains an oxidizing agent, e.g. hydrogen peroxide $H_2O_2$. Choline is also suitable as an alkaline component. Aqueous solutions can be disposed of easily.

In a subsequent development, the initial metalization stratum contains a metal layer which is made of aluminum or of an aluminum alloy. By way of example, the initial metalization stratum is made of an aluminum/silicon alloy, of an aluminum/silicon/copper alloy or of an aluminum/copper alloy. The additional components for the aluminum are usually below 5 wt % (percent by weight). Although aluminum has a higher electrical resistance than copper, it can be patterned more easily. In particular, no contamination problems arise with aluminum.

In a subsequent development with a metal layer containing aluminum in the initial metalization stratum, a liquid used for wet chemical etching has an oxidizing agent admixed with it which oxidizes the metal layer. In one refinement, this oxidizing agent is hydrogen peroxide $H_2O_2$ or an $H_2O_2$ solution. The oxidation layer on the metal layer prevents the metal layer from being attacked by the means for removing the intermediate layer and dissolves oxides from the intermediate layer, e.g. titanium dioxide. In one refinement, the hydrogen peroxide solution is between 30% strength and 40% strength. In particular, a 35% strength hydrogen peroxide solution is commercially available and is frequently used for fabricating integrated circuits. As an alternative to the hydrogen peroxide, other oxidizing agents can be used, for example liquids containing ozone $O_3$, such as water.

In one development with an etching bath comprising aqueous ammonia and hydrogen peroxide solution, these constituents are mixed in a ratio by volume of between 10:1 and 30:1. Good results can be achieved with a ratio by volume of 20:1.

In a subsequent development, the oxide layer which forms during wet chemical etching is removed from a metal layer in the initial metalization stratum. This measure prevents the electrical resistance from being increased in the region of the vias.

In a subsequent development, the oxide layer is removed using a back sputtering process before the cutout is filled. If the cutout is filled using a sputtering method, back sputtering means only a small amount of additional complexity. In addition or alternatively to back sputtering, the oxide layer can also be removed using a wet chemical etching process. By way of example, an aluminum oxide layer $Al_2O_3$ can be removed very well using choline or using a choline solution. Choline is a base having the structural formula:

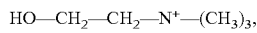

where the nitrogen atom is positively charged and is connected to four carbon atoms. In one refinement, the choline solution is between 0.05% strength and 0.5% strength. Good results can be achieved with a 0.1% strength choline solution.

In a subsequent development, the intermediate layer is made of tantalum nitride. Tantalum nitride has similar properties to titanium nitride and can also be removed using similar chemical methods.

In a subsequent development, the initial metal stratum contains a metal layer which is made of copper or of a copper alloy. By way of example, the initial metalization stratum is produced using a "damascene" or dual "damascene" method.

In another development, the further metalization stratum contains a metal layer made of aluminum or of an aluminum alloy, particularly an aluminum/silicon alloy, an aluminum/silicon/copper alloy or an aluminum/copper alloy. The additional components to the aluminum are usually below 5 wt % (percent by weight).

Alternatively, the further metalization stratum contains a metalization stratum made of copper or of a copper alloy.

In a subsequent development, the cutout contains tungsten, aluminum, an aluminum alloy, copper or a copper alloy. Tungsten can be introduced in a good filling ratio.

For producing the initial metalization stratum or the further metalization stratum, one development involves the following steps being carried out:
a metal layer is applied,
the intermediate layer is applied, and
the metal layer and the intermediate layer are patterned, particularly using a lithographical method or using the damascene technique.

In another development, the method is used to produce a contact having a contact area larger than 10 µm² (square microns), larger than 100 µm², larger than 1000 µm² or larger than 5000 µm². Such large contact areas are used in "smart power" circuits in order to be able to switch very large currents, e.g. currents which are larger than 1 mA (milliamps), larger than 10 mA or else larger than 100 mA for the contact area. Particularly in the case of the associated switching powers, the technical effects of the inventive method are found to be particularly intense. By way of example, motors are actuated using these circuits.

Alternatively, the method is also used for contact areas which are smaller than 10 µm² or smaller than 1 µm², however.

The invention also relates to an integrated circuit arrangement which contains a plurality of metalization strata. Two metalization strata are connected by at least one electrically conductive connecting section which is situated in a cutout. The cutout extends through an insulating layer between the metalization strata and through an intermediate layer. At the boundary between insulating layer and intermediate layer, the cutout has a projecting edge which is formed, by way of example, on the basis of an undercut at the boundary between intermediate layer and metal layer. In other words, the cutout extends at the boundary abruptly as compared with the rest of its profile. Such a circuit arrangement is produced when the inventive method or one of its developments is applied. The technical actions cited above thus also apply to the integrated circuit arrangement.

In one development, the circuit arrangement is suitable for the purpose of switching powers higher than 100 W, i.e. it is a power circuit arrangement, also referred to as a power device.

BRIEF DESCRIPTION OF THE DRAWING

Exemplary embodiments of the invention are explained below with reference to the accompanying drawings, in which:

BRIEF DESCRIPTION OF THE DRAWINGS

Figure 2:
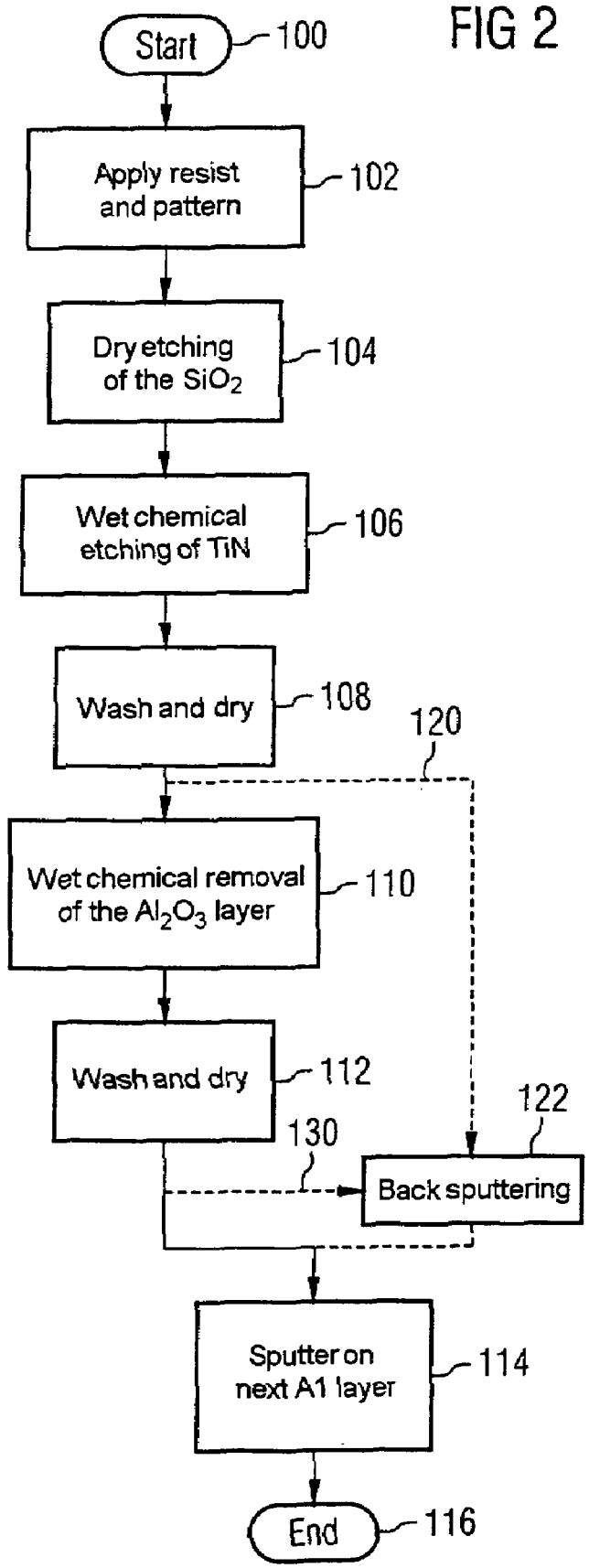

FIGS. 1A to 1C show fabrication stages in the fabrication of an integrated circuit arrangement, and FIG. 2 shows method steps in a method in which titanium nitride is removed.

DETAILED DESCRIPTION

As FIG. 1A shows, an integrated circuit arrangement 10 has been fabricated by first applying an aluminum layer 12 to a prefabricated portion of the integrated circuit arrangement 10. The prefabricated portion contains active semiconductor elements in a silicon substrate. The aluminum layer 12 has had a titanium nitride layer 14 applied to it which, by way of example, has a thickness of 45 nm (nanometers) and serves as an antireflection layer, for example.

Following application of the titanium nitride layer 14, the titanium nitride layer 14 and the aluminum layer 12 have been patterned using a photolithographic method including an etching method, with, for example, $BCl_3$, and an interconnect 16 in a metalization stratum 18 has been produced.

The patterned metalization stratum 18 has then had a silicon dioxide layer 20 applied to it, for example using a silane-based method ($SiH_4$). Above the remainder of the titanium nitride layer 14, the silicon dioxide layer 20 has a thickness of between 0.5 µm and 1.5 µm, for example.

The silicon dioxide layer 20 has then had a photoresist layer 22 applied to it. The photoresist layer 22 has been selectively exposed using a mask, particularly above the remainder of the titanium nitride layer 14, see arrow 24. The photoresist layer 22 has then been developed, and a cutout 26 has been produced in the photoresist layer 22 above the titanium nitride layer 14, the bottom of said cutout being on the silicon dioxide layer 20.

As FIG. 1B shows, a dry etching process has then been carried out in which the cutout 26 has been extended to form a cutout 26a which has the same diameter as the cutout 26 but is deeper. The bottom of the cutout 26a is on the titanium nitride 14 or in the titanium nitride layer 14. The dry etching is performed using carbon tetrafluoride $CF_4$, for example. The dry etching process is carried out either using end-point identification or under time control.

Suitable dry etching methods are plasma etching, reactive ion etching or electron beam etching.

In another exemplary embodiment, the dry etching process is ended under time control before the silicon dioxide layer 20 has been etched through. That portion of the silicon dioxide layer which remains at the bottom of the cutout is subjected to wet chemical etching together with the intermediate layer, i.e. the titanium nitride layer 14 in the exemplary embodiment.

As FIG. 1C shows, a wet chemical etching process is then carried out in order to remove the titanium nitride layer 14 in the region of the cutout 26a. In this case, a cutout 26b whose bottom is approximately at the boundary between the titanium nitride layer 14 and the aluminum layer 12 is produced from the cutout 26a. The wet chemical etching bath used is a mixture of a 35% strength aqueous hydrogen peroxide solution and of an approximately 28% strength aqueous ammonia solution. The ratio by volume of hydrogen peroxide solution to ammonia solution is 20:1. The wet chemical etching is performed at room temperature.

The wet chemical etching is isotropic, which means that the silicon dioxide layer 20 is undercut by etching. The width B of the undercut has approximately the same value as the layer thickness D of the titanium nitride layer 14, i.e. the width B is approximately 80 nm in the exemplary embodiment. The side faces of the cutout 26b in the region of the titanium nitride layer 14 are inclined, with the distance between the side faces increasing toward the boundary between titanium nitride layer 14 and silicon dioxide layer 20. At the bottom of the cutout 26b, the diameter is at its original value again, in the exemplary embodiment, i.e. it is approximately equal to the diameter of the cutout 26 or 26a. Instead of inclined side faces, rounded side faces also appear.

In another exemplary embodiment, particularly with a high level of overetching, the diameter at the bottom of the cutout 26b is larger than in the top region of the cutout 26b.

Depending on the thickness of the titanium nitride layer 14, the etching time for the wet chemical etching is between 3 min (minutes) and 20 min.

The wet chemical etching process also involves the formation of an aluminum oxide layer 30 on the remainder of the aluminum layer 12, said aluminum oxide layer 30 being a few nm thick and preventing the aluminum layer 12 from being attacked by the etching bath.

FIG. 2 shows method steps in the fabrication of the integrated circuit arrangement 10. The method starts in a method step 100. a method step 102 corresponds to the application of the photoresist layer 22 and patterning thereof which have been explained above with reference to FIG. 1A.

A method step 104 has been explained in more detail above with reference to FIG. 1B and concerns the dry etching of the silicon dioxide layer 20 using fluorine-containing chemicals, which proceeds in line with the following formula, for example:

$$Si+4F \rightarrow SiF_4.$$

A method step 106 relates to the wet chemical etching of the titanium nitride layer 14. The method step 106 has already been explained above with reference to FIG. 1C and proceeds in line with the following formulae, for example:

$$2TiN+4OH^- \rightarrow TiO^{2+}N_2+H_2O$$

$$4Al+3H_2O_2 \rightarrow 2Al_2O_3+3H_2.$$

The wet chemical etching also involves removal of the photoresist layer 22.

Method step 106 is followed by a method step 108 in which the integrated circuit arrangement 10 is washed with water and is then dried.

In a subsequent method step 110, the aluminum dioxide layer 30 is removed using a wet chemical method. The etching bath used this time is a dilute basic aqueous solution, e.g. a 0.1% strength choline solution. By way of example, the integrated circuit arrangement 10 is dipped into the choline solution for 30 s (seconds) at room temperature.

In a subsequent method step 112, the integrated circuit arrangement 10 is washed, e.g. in water, and dried.

Method step 112 is followed by a method step 114 in which removal of the remainders of the photoresist layer 22 is followed by the start of sputtering of a next metalization stratum. In the process, the cutout 26b is also filled with aluminum.

The method is ended in a method step 116 after contact areas for connecting external connecting wires or for bearing solder balls have been exposed on the integrated circuit arrangement 10.

In another exemplary embodiment, instead of method steps 110 and 112, method step 108 is followed by the performance of a method step 122 in which the aluminum oxide layer 30 is removed by back sputtering in argon, see also arrow 120. The back sputtering is again followed by method step 114, in which the next aluminum layer is sputtered on, said next aluminum layer being used to produce the next metalization strata.

In another exemplary embodiment, in addition to method steps 110 and 112, method step 122 is performed, see arrow 130. In the case of this variant, it is not necessary for the aluminum oxide layer 30 to be removed completely by wet chemical means. On the other hand, a thin oxide layer which forms upon washing and drying is also removed again on the exposed metal, for example if washing with water.

The method explained prevents particle formation in a plasma etching system when removing the titanium nitride layer. The result of this is longer endurance times between chamber cleaning operations, which means that throughput increases and costs fall. In addition, the process speed for wet chemical removal of the titanium nitride layer is higher than when a dry etching method is used. Furthermore, the etching rate in the case of wet chemical removal of the titanium nitride is not dependent on the exposed area of the titanium nitride.

In another exemplary embodiment, the photoresist layer 22 is removed before the wet chemical etching in method step 106 but after the dry etching in method step 104. This means that the etching solutions are not unnecessarily contaminated.

Particularly in the case of a copper layer instead of the aluminum layer 12, the wet chemical etching solution used can also be a solution of nitric acid $HNO_3$ and hydrofluoric acid HF in a mixture range of between 3:1 and 1000:1, e.g. nitric acid $HNO_3$ at a concentration c of 10 mol/l and hydrofluoric acid HF at a concentration c of 3 mol/l.

The wet chemical etching is carried out by means of immersion etching, spray etching or rotation etching, for example.

The invention claimed is:

1. A method for fabricating an integrated circuit arrangement comprising:
    providing an initial metallization stratum covered by and in contact with an intermediate layer;
    forming an insulating layer on the intermediate layer;
    patterning the insulating layer to form at least one cutout using a dry etching process;
    extending the cutout using a wet chemical etching process, wherein the intermediate layer is removed in a region exposed by the cutout and a surface region of the initial metallization stratum is exposed;
    producing at least one further metalization stratum by filling the cutout with one of a metal or a metal alloy;
    wherein the initial metallization stratum comprises a metal layer which comprises one of aluminum or an aluminum alloy,
    and wherein a liquid used for the wet chemical etching process comprises an oxidizing agent that oxidizes the metal layer.

2. The method as claimed in claim 1, wherein the intermediate layer comprises a nonoxidic metal compound comprising one of titanium nitride, or tantalum nitride.

3. The method as claimed in claim 2, wherein removing the intermediate layer comprises using one or more of an alkali metal hydroxide, a base, an aqueous ammonia solution with a basic action having a strength between 20% and 35%.

4. The method as claimed in claim 1, wherein the oxidizing agent comprises one of hydrogen peroxide or an aqueous hydrogen peroxide solution having a hydrogen peroxide strength of 30% to 40%.

5. The method as claimed in claim 4, wherein the oxidizing agent comprises a liquid containing ozone.

6. The method as claimed in claim 1, wherein the oxidizing agent comprises a mixture of an aqueous ammonia solution and a hydrogen peroxide solution in a ratio by volume of between 10:1 and 30:1.

7. The method as claimed in claim 1 further comprising removing an oxide layer from the initial metallization stratum, which forms during extending the cutout.

8. The method as claimed in claim 7, wherein the oxide layer is removed using one of a back sputtering process before the cutout is filled, or a wet chemical etching process comprising one of a base or a thinned basic aqueous solution comprising an aqueous choline solution, wherein the choline solution has a strength between 0.05% and 0.5%.

9. The method as claimed in claim 1, wherein using a dry etching process comprises one of using the intermediate layer as an etching stop layer in the dry etching process, or stopping the dry etching process in the insulating layer, and wherein the method further comprises removing a portion of the insulating layer during the wet chemical etching process.

10. The method as claimed in claim 1, wherein providing a metallization stratum comprises providing one of a) a metal layer comprising one of aluminum or an aluminum alloy, or b) a metal layer comprising one of copper or a copper alloy.

11. The method as claimed in claim 1, wherein filling the cutout comprises filling the cutout with one of tungsten, aluminum, an aluminum alloy, copper, or a copper alloy.

12. The method as claimed in claim 1, wherein one or both of providing the initial metallization stratum or producing the further metallization stratum comprises:
    applying a metal layer comprising one of a metal or a metal alloy;
    applying an intermediate layer on the metal layer comprising one of a metal nitride or a metal containing a metal nitride; and
    patterning the metal layer and the intermediate layer.

13. The method as claimed in claim 1, wherein using the dry etching process comprises using a chemicophysical method including one of a reactive ion etching method or a plasma etching process.

14. The method as claimed in claim 1, wherein the method is used to produce a contact having a contact area greater than 10 $\mu m^2$.

15. The method as claimed in claim 1 wherein patterning the insulating layer further comprises applying a resist layer and removing the resist layer before using the wet chemical etching process.

16. The method as claimed in claim 1, wherein the oxidizing agent comprises a mixture of an aqueous ammonia solution and a hydrogen peroxide solution in a ratio by volume of 20:1.

17. The method as claimed in claim 14, wherein the method is used to produce a contact area ranging from greater than 100 $\mu m^2$ to greater than 5000 $\mu m^2$.

18. The method as claimed in claim 1, wherein the method is used to produce a contact having area smaller than 10 $\mu m^2$.

19. The method as claimed in claim 18, wherein the method is used to produce a contact having a contact area smaller than 1 $\mu m^2$.

20. A method for fabricating an integrated circuit arrangement comprising:
    providing a metallization layer covered by and in contact with an intermediate layer;
    forming an insulating layer on the intermediate layer;
    patterning the insulating layer to form at least one opening using a dry etching process;
    extending the opening using a wet chemical etching process and removing the intermediate layer in a region exposed by the opening and exposing a surface region of the initial metallization stratum,
    wherein the wet chemical etching process comprises an oxidizing agent that oxidizes the metallization layer; and
    filling the opening with one of a metal or a metal alloy.

21. The method as claimed in claim 20, wherein using a dry etching process comprises one of using the intermediate layer as an etching stop layer in the dry etching process, or stopping the dry etching process in the insulating layer, and wherein the method further comprises removing a portion of the insulating layer during the wet chemical etching process.

22. The method as claimed in claim 20, wherein removing the intermediate layer comprises using one or more of an alkali metal hydroxide, a base, an aqueous ammonia solution with a basic action having a strength between 20% and 35%.

23. The method as claimed in claim 20 further comprising removing an oxide layer from the metallization layer, which forms during extending the opening.

24. The method as claimed in claim 23, wherein the oxide layer is removed using one of a back sputtering process before the opening is filled, or a wet chemical etching process comprising one of a base or a thinned basic aqueous solution comprising an aqueous choline solution, wherein the choline solution has a strength between 0.05% and 0.5%.

* * * * *

UNITED STATES PATENT AND TRADEMARK OFFICE
CERTIFICATE OF CORRECTION

PATENT NO. : 7,381,645 B2 Page 1 of 1
APPLICATION NO. : 11/148861
DATED : June 3, 2008
INVENTOR(S) : Göllner et al.

It is certified that error appears in the above-identified patent and that said Letters Patent is hereby corrected as shown below:

On the Title Page

Item (30), delete "102 57 681" and substitute --102 57 681.5-- in its place.

Item (57), line 4, under "ABSTRACT", before "strata are produced" delete "metalization" and substitute --metallization-- in its place.

In the Claims

In column 7, claim 1, line 35, after "at least one further" delete "metalization" and substitute --metallization-- in its place.

Signed and Sealed this

Twelfth Day of May, 2009

JOHN DOLL
*Acting Director of the United States Patent and Trademark Office*